United States Patent
Bergmann et al.

(10) Patent No.: US 7,899,099 B2
(45) Date of Patent: Mar. 1, 2011

(54) LASER DRIVE CIRCUIT AND USE

(75) Inventors: Guenther Bergmann, Blaustein (DE);
Karl-Josef Gropper, Senden (DE);
Herbert Knotz, Erbach (DE); **Stefan
Schabel, Syrgenstein (DE); Holger
Vogelmann**, Schwendi (DE)

(73) Assignee: Atmel Automotive GmbH, Heilbronn (DE)

( * ) Notice: Subject to any disclaimer, the term of this patent is extended or adjusted under 35 U.S.C. 154(b) by 46 days.

(21) Appl. No.: 12/422,969

(22) Filed: Apr. 13, 2009

(65) Prior Publication Data

US 2009/0262769 A1    Oct. 22, 2009

Related U.S. Application Data

(60) Provisional application No. 61/044,189, filed on Apr. 11, 2008.

(30) Foreign Application Priority Data

Apr. 11, 2008   (DE) .......................... 10 2008 018 602

(51) Int. Cl.
*H01S 3/00*   (2006.01)

(52) U.S. Cl. ................. 372/38.02; 372/38.03; 372/38.07
(58) Field of Classification Search ................ 372/38.02
See application file for complete search history.

(56) References Cited

U.S. PATENT DOCUMENTS

| 5,640,381 | A | 6/1997 | Call et al. |
| 7,200,091 | B2 * | 4/2007 | Masui et al. ............... 369/59.11 |
| 2007/0096963 | A1 | 5/2007 | De Boer et al. |
| 2007/0147450 | A1 | 6/2007 | Inoue et al. |
| 2008/0008066 | A1 * | 1/2008 | Rees et al. ................. 369/47.15 |
| 2008/0074970 | A1 | 3/2008 | Itoga et al. |

* cited by examiner

*Primary Examiner* — Minsun Harvey
*Assistant Examiner* — Xnning Niu
(74) *Attorney, Agent, or Firm* — Muncy, Gessler, Olds & Lowe, PLLC

(57) ABSTRACT

A laser drive circuit and use of digital-to-analog converters is provided, each with a current input and a current output to set current values of partial currents switchable by means of digital channel signals to provide a laser current pulse at least on the basis of a sum of partial currents, wherein at least one current output of one of the digital-to-analog converters is connected to at least one current input of an additional digital-to-analog converter via an analog switch.

14 Claims, 3 Drawing Sheets

LASER DRIVE CIRCUIT AND USE

This nonprovisional application claims priority to German Patent Application No. DE 10 2008 018 602.3, which was filed in Germany on Apr. 11, 2008, and to U.S. Provisional Application No. 61/044,189, which was filed on Apr. 11, 2008, and which are both herein incorporated by reference.

BACKGROUND OF THE INVENTION

1. Field of the Invention

The present invention relates to a laser drive circuit and a use thereof.

2. Description of the Background Art

For drives in which compact discs are provided as storage media, laser semiconductor diodes are used to read information from the storage media or to write the information. Laser diodes are needed in different wavelength ranges depending on the employed storage medium technology. Defined light pulses emitted by the laser diode are needed to read or write information on a storage medium. The pulses in this case must be matched to the employed laser diode and the employed storage medium. A matching of this type can also be described as a write strategy in the case of a writing process.

A circuit for current control for a laser is known from U.S. Pat. Application No. 2007/0147450 A1. The circuit has a plurality of digital-to-analog converters, whose output voltage is converted to an output current in each case by a voltage-to-current converter.

A circuit for driving a laser is known from U.S. Pat. No. 5,640,381. The circuit has a plurality of digital-to-analog converters, whose output voltage is converted to a current in each case by means of a controllable current source.

A device for generating a drive signal for a laser is disclosed in U.S. Pat. Application No. 2007/0096963 A1. The output voltages are demultiplexed by digital-to-analog converters and stored in capacitors. The amplification of the digital-to-analog converters is set by reference currents. In contrast, U.S. Pat. Application No. 2008/0074970 A1 discloses a method for writing on an optical disk. U.S. Pat. Application No. 2008/0008066 A1 discloses a driver for a laser diode with a decoder.

SUMMARY OF THE INVENTION

It is therefore an object of the present invention to improve a drive circuit for a laser diode as much as possible.

Accordingly, a laser drive circuit is provided which is formed to drive the output current pulses for a semiconductor laser diode. The current pulses, preferably defined as to their shape, are provided here by the laser drive circuit, whereby the defined shape, therefore the course, amplitude, and length of the current pulse, is can be settable as variable. Preferably, the laser drive circuit is integrated monolithically on a semiconductor chip.

The laser drive circuit has a number of input channels for receiving digital input channel signals. The input channels thereby form a digital parallel interface for the parallel receiving of the digital input channel signals. The digital input channel signals are used to define the current pulses shape; the digital input channel signals of the different input channels may have a pulse length different from one another and/or can be offset in time to one another. The parameters of the digital input channel signals may be set, for example, by a control circuit connectable to the laser drive circuit.

The laser drive circuit has several digital-to-analog converters. For example, the laser drive circuit has two digital-to-analog converters, preferably, however, at least three digital-to-analog converters. A digital-to-analog converter converts a digital input value into an analog signal. At least one digital-to-analog converter is assigned to each input channel. If, for example, five input channels are provided, then the five input channels are each assigned a digital-to-analog converter, so that five digital-to-analog converters are provided in this exemplary embodiment.

Each digital-to-analog converter has a current input and a current output. Thereby, the output current flowing through the current output depends on an input current flowing through the current input. Furthermore, the digital-to-analog converter has a digital data input. For example, the digital data input is a parallel input with, for example, a bit width of 8 bits.

Each digital-to-analog converter is formed to amplify an input current at a current input of the digital digital-to-analog converter by means of analog current amplification and to output the amplified current as an output current at the current output of the digital-to-analog converter. The analog current amplification can be realized, for example, by means of a current mirror, a mirror factor of the current mirror representing the analog current amplification. In this regard, the digital-to-analog converter is formed to convert the digital input value at the digital data input into the analog current amplification. For example, it is possible to provide a current amplification between 0 and the value 1. It is likewise possible to provide a current amplification greater than the value of 1. In an alternative or also combinable embodiment, moreover, an analog current amplification <0 may be provided.

Furthermore, the laser drive circuit has a switching amplifier device, which is formed to switch and to amplify one or more current signals. Each input channel of the laser drive circuit is connected to a switch input of the switching amplifier device directly or, for example, indirectly via a logic. Accordingly, the digital input channel signals affect the switching processes in the switching amplifier device. The current output of each digital-to-analog converter is connected to a current input of the switching amplifier device.

The switching amplifier device is formed thereby to switch each output current of each digital-to-analog converter according to the input channel signal of the input channel associated with the digital-to-analog converter, to sum it, and to output it amplified at least one output of the switching amplifier device. Thereby, the switching amplifier device can be formed differently relative to the function of switching, summation, and amplification. For example, it is possible to switch and to amplify the output currents of the digital-to-analog converter by means of a switchable amplifier and then to sum the amplified currents. Alternatively, it is also possible to switch first the output currents of the digital-to-analog converter, to sum the switched currents, and then to amplify them.

Furthermore, the object of the invention is to provide a use improved as much as possible.

Accordingly, a use of digital-to-analog converters to set current values of switchable partial currents to provide a laser current pulse is provided. The digital-to-analog converters each have a current input and a current output. The partial currents are switchable by means of digital input channel signals. The laser current pulse is provided at least on the basis of a sum of the partial currents. In addition, additional partial currents such as, for example, the output current of an oscillator can be part of the sum to provide the laser current pulse.

At least one current output of one of the digital-to-analog converters is connectable to at least one current input of an additional digital-to-analog converter by means of a current switch.

The refinements described hereinafter refer both to the laser drive circuit and to the use.

According to an embodiment, the laser drive circuit has at least one current switch. A current input of at least one digital-to-analog converter of the digital-to-analog converters is connected to the at least one current switch. In this case the current switch is formed, for example, as a switching transistor (FET), transmission gate, or switchable current mirror. Preferably, the current switch is formed as changeover switch for switching various currents to be switched.

In another embodiment, a current output of at least one digital-to-analog converter is connectable or connected to a current input of at least one additional digital-to-analog converter. For example, the current output is connectable to the current input by a current switch. Alternatively, it can be provided that the current output is connected conductively to the current input, for example, by means of a trace.

This connection of the digital-to-analog converter and of the additional digital-to-analog converter preferably forms a series connection; here, both current amplifications of the two digital-to-analog converters through which current flows act on the output current of the additional digital-to-analog converter. If, for example, the amplification of the digital-to-analog converter increases, this also causes a corresponding increase in the output current at the additional digital-to-analog converter.

According to an embodiment, it is provided that the current output of the at least one digital-to-analog converter can be connectable to the current input of the additional digital-to-analog converter by means of the aforementioned current switch.

The at least one current switch is connected to a first reference current source to provide a first reference current and/or to a second reference current source to provide a second reference current. By means of this connection and the at least one current switch, the first reference current or the second reference current is connectable to the current input of the digital-to-analog converter.

In an embodiment, the laser drive circuit can have a master channel and a number of slave channels. Thereby, one of the digital-to-analog converters is assigned to the master channel. Furthermore, additional digital-to-analog converters are provided and each of these additional digital-to-analog converters is assigned one of the slave channels. The current output of the digital-to-analog converter assigned to the master channel is connectable to the current inputs of the digital-to-analog converter assigned to the slave channels. In order to connect the current output to the current inputs of the digital-to-analog converters assigned to the slave channels, preferably each digital-to-analog converter of each slave channel is assigned in addition a current switch and is connected to the current input of the respective digital-to-analog converter.

In a further embodiment, the laser drive circuit can have a master channel and a number of slave channels. In this regard, one of the input channels is defined as the master channel. Furthermore, one or more of the additional input channels are defined as slave channels. Thereby, each slave channel has a configurable logic. Advantageously, the input channel signals of the slave channels are logically linkable by the configurable logic to the input channel signal of the master channel for switching by the switching amplifier device. This type of logical operation is, for example, a logical AND, a logical OR, or a logical EXCLUSIVE-OR. Preferably, the logical operation is deactivatable.

According to an embodiment, it is provided that the switching amplifier device has means for setting the amplification of the switching amplifier device. The means are preferably switchable amplifier units, connected parallel to one another, or a multiplier. For example, four amplifier units connected in parallel are provided, so that the amplification is switchable between the values of 0.25 and 0.50 and 0.75 and 1.00.

In an embodiment, the laser drive circuit has an oscillator whose output is connected to a switch input of the switching amplifier device to output a digital oscillator signal. Furthermore, the laser drive circuit preferably has an additional digital-to-analog converter, whose current output to output an additional output current is connected to a current input of the switching amplifier device. The switching amplifier device is preferably formed to switch the additional output current in the oscillator signal clock. Advantageously, the additional output current is likewise a component of the summation in the switching amplifier device, so that this summand can also be output amplified at the at least one output.

According to an embodiment, the laser drive circuit can have an additional analog switch, which is connected to an additional current input of the additional digital-to-analog converter. In addition, the analog switch is connected to the first reference source and/or to the second reference source. Alternatively or in combination, the analog switch is connected to one or more of the current outputs of the digital-to-analog converter of the input channels.

In an embodiment, the laser drive circuit has an additional configurable logic, whose output is connected to an input of the oscillator and/or to the additional digital-to-analog converter. Preferably, the additional configurable logic is formed to change a gating of the oscillation of the oscillator and/or an oscillator frequency of the oscillator and/or an amplitude of the oscillator signal and/or a phase of the oscillator signal by means of a logical linking of one or more input channel signals of the channels. To change the oscillator frequency of the oscillator, it is possible to change a digital code for the oscillator frequency by means of switching, initiated by the additional logic, to another register. Alternatively, it is possible to change the oscillator frequency by activating or deactivating a frequency divider in the oscillator. To change the amplitude of the oscillator, it is possible to change a digital code for the amplitude by means of switching, initiated by the additional logic, between two registers. A change in the phase can occur advantageously by a switching of the phase in the oscillator.

The additional configurable logic can be connected to one or more input channels for the logical linkage of one or more input channel signals of the channels. Advantageously, the additional configurable logic is connected to an additional control input of the laser drive circuit.

The digital-to-analog converters assigned to the input channels or the oscillator can have amplification. Accordingly, the digital-to-analog converters have a current input as the analog input and a current output as the analog output.

Each analog input of each digital-to-analog converter is formed as a current input. Each analog output of each digital-to-analog converter is formed as a current output to output an output current as the analog output signal. If a plurality of currents is necessary, the current output may also have a plurality of individual outputs for similar currents. Each digital-to-analog converter is formed preferably for analog current amplification of an input current as an analog input signal depending on the digital input value at the digital data input. Preferably, the switching amplifier device has current inputs as analog inputs.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
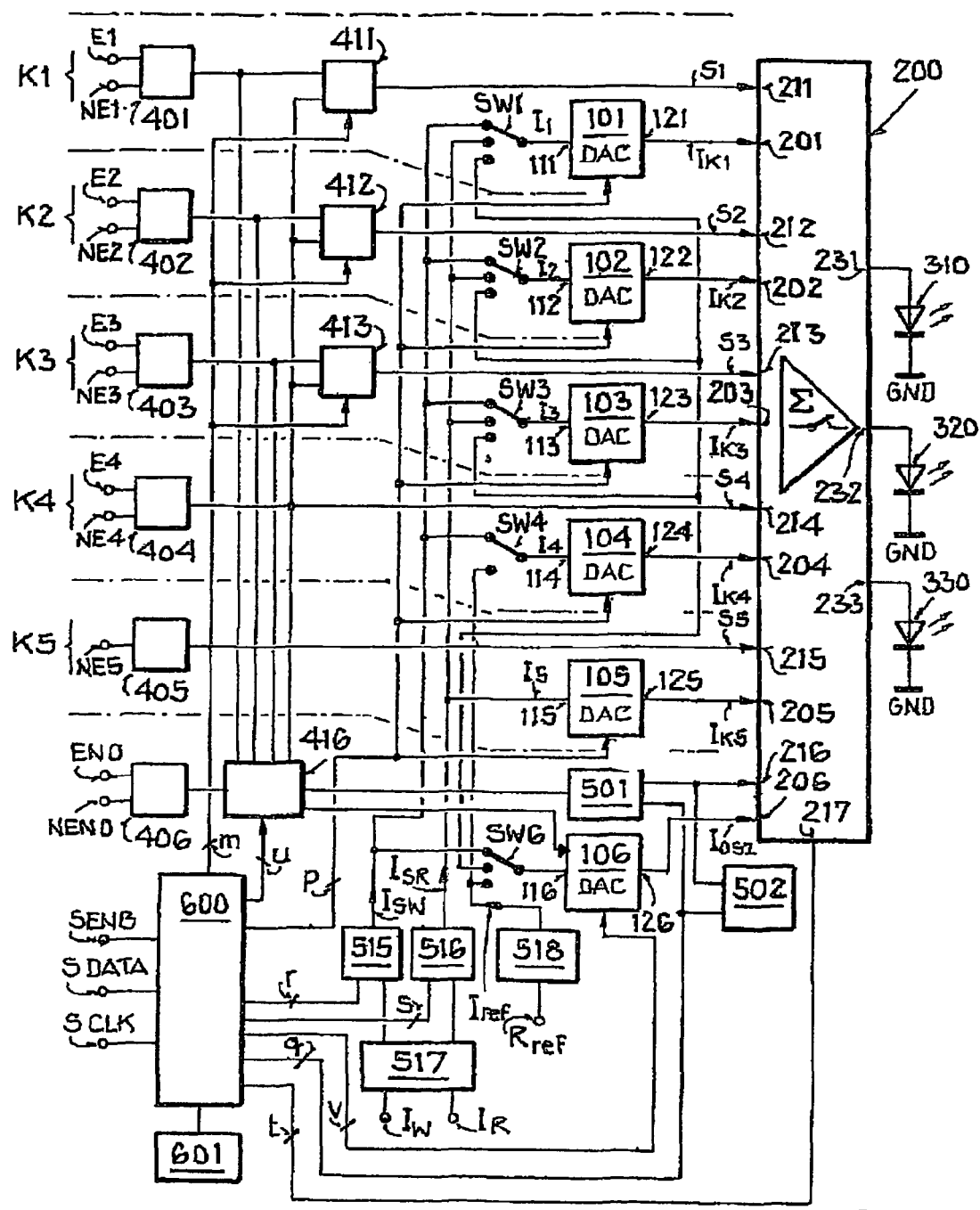
FIG. 1 shows a schematic block diagram of a laser drive circuit.

FIG. 1 shows a schematic block diagram of a laser drive circuit. Also shown by way of example are three laser diodes 310, 320, 330, which are connected to outputs 231, 232, and 233 of a switching amplifier device 200 of the laser drive circuit. The exemplary embodiments with current inputs, current outputs, and current amplifications will be described hereinafter as a preferred exemplary embodiment.

According to the exemplary embodiment of FIG. 1, switching amplifier device 200 has current inputs 201, 202, 203, 204, 205, and 206; here, switching amplifier device 200 is formed and set up to switch currents flowing through inputs 201, 202, 203, 204, 205, and 206, to amplify them and to sum them, and to provide them at one of outputs 231, 232, 233 to the respective laser diode 310, 320, 330. To switch input currents $I_{k1}$, $I_{k2}$, $I_{k3}$, $I_{k4}$, $I_{k5}$, and $I_{OSZ}$ at current inputs 201, 202, 203, 204, 205, and 206, switching amplifier device 200 has a number of corresponding switch inputs 211, 212, 213, 214, 215, and 216.

At least some of current inputs 201, 202, 203, 204, and 205 and some of switch inputs 211, 212, 213, 214, 215 are each assigned to an input channel K1, K2, K3, K4, or K5, respectively. In each case, a current input 201, 202, 203, 204, and 205 of switching amplifier device 200 is connected to a current output 121, 122, 123, 124, or 125, respectively, of a digital-to-analog converter 101, 102, 103, 104, or 105, respectively. Thereby, the digital-to-analog converters 101, 102, 103, 104, and 105 are also each assigned to an input channel K1, K2, K3, K4, or K5, respectively.

Each digital-to-analog converter 101, 102, 103, 104, and 105 in each case has a current input 111, 112, 113, 114, or 115, respectively. Current inputs 111, 112, 113, and 114 of digital-to-analog converters 101, 102, 103, and 104 are each connected to a current switch SW1, SW2, SW3, and SW4. An input current $I_1$, $I_2$, $I_3$, $I_4$, or $I_5$, flowing at input 111, 112, 113, 114, 115 of the respective digital-to-analog converter 101, 102, 104, 105, is amplified in the respective digital-to-analog converter 101, 102, 103, 104, 105 and output amplified as an amplified output current $I_{k1}$, $I_{k2}$, $I_{k3}$, $I_{k4}$, or $I_{k5}$, respectively, at current output 121, 122, 123, 124, 125 of the respective digital-to-analog converter 101, 102, 103, 104, 105. If a plurality of current inputs is fed through a current output 121, 122, 123, 124, 125 of the respective digital-to-analog converter 101, 102, 103, 104, 105, said current output 121, 122, 123, 124, 125 has a plurality of individual outputs with the same currents. For the sake of simplification, this is not shown in FIG. 1. Here, the amplification can be equal to 1 or greater than 1 or less than 1 or less than 0.

Current switches SW1, SW2, and SW3, which enable switching between currents $I_{SW}$ and $I_{SR}$ and output current $I_{k4}$ of fourth digital-to-analog converter 104 by means of a suitable connection, are connected at the current inputs of digital-to-analog converters 101, 102 and 103. Reference currents $I_{SW}$ and $I_{SR}$ are generated from the input reference currents $I_W$ and $I_R$, which flow through the inputs of the laser drive circuit. Alternatively, input voltages may also be used, whereby these must be converted by the voltage current transformer into the reference currents $I_{SW}$ and $I_{SR}$. The reference current $I_{SR}$ is preferably however not assigned necessarily to a reader mode. The reference current $I_{SW}$ is preferably however not assigned necessarily to a write mode. Advantageously, the reference currents $I_{SW}$ and $I_{SR}$ are moreover also used in combination. The input reference currents $I_W$ and $I_R$ are generated after a current limitation by limiter 517 by scaling by means of the adjustable current amplifiers 515 and 516. In this regard, the adjustable current amplifiers 515 and 516 have an amplification less than or equal to 1 or greater than 1.

In addition, a reference current $I_{ref}$ may be provided by means of a reference voltage or a reference resistance at an additional input $R_{REF}$ by means of a current source 518 dependent hereon. The reference current $I_{ref}$ can be supplied as input current $I_{k4}$ for switching amplifier device 200. To this end, reference current $I_{ref}$ is switched to current input 114 of digital-to-analog converter 104 by means of a current switch SW4, which is connected to current input 114 of fourth digital-to-analog converter 104, and amplified by it.

Furthermore, current $I_{ref}$ of current source 518 can be used as the input current for an additional digital-to-analog converter 106. The additional digital-to-analog converter 106 is assigned to an oscillator or high-frequency modulator 501. To output an oscillator current $I_{OSZ}$, a current output 126 of the additional digital-to-analog converter 106 is connected to a current input 206 of switching amplifier device 200. A current input 116 of an additional digital-to-analog converter 106 is connected to an additional current switch SW6, which for switching between reference current $I_{ref}$, reference current $I_{SW}$, and output current $I_{k4}$ is connected to fourth digital-to-analog converter 104 assigned to fourth input channel K4.

An input current flowing at input 116 of the additional digital-to-analog converter 106 is amplified in the additional digital-to-analog converter 106 and output amplified as amplified output current $I_{OSZ}$ at current output 126 of the additional digital-to-analog converter 106. Here, the amplification can be equal to 1 or greater than 1 or less than 1 or less than 0. The current amplification can be adjusted via a v-bit wide data line. The additional digital-to-analog converter 106 is connected to a logic 416 by an additional control line for switching between two amplification values. To this end, the switching can occur by means of the control line, for example, between two registers with different values for the amplification, so that switching can occur between two amplitudes of the oscillator signal. The output current $I_{OSZ}$ reaches current input 206 of switching amplifier device 200. An output of oscillator 501 is connected to a switch input 216 of switching amplifier device 200, whereby switch input 216 is assigned to current input 206. Switching device 200 is formed in this case to switch oscillator current $I_{OSZ}$ in the output signal clock of oscillator 501.

The current switched in the output signal clock of oscillator 501 is used thereby to reduce the laser mode noise. In addition, the oscillations of oscillator 501 can be counted by frequency counter 502. For example, said frequency counting by frequency counter 502 is part of frequency control. To this end, it is preferable for an oscillator frequency of oscillator 501 to be adjustable.

Oscillator 501 can be turned on and off by means of inputs ENO and NENO via input stage 406 and logic 416, so that the output signal of oscillator 501 can be activated or deactivated depending on the shape of the desired current pulse for the laser. Variable logic gate 416 is inserted between input stage 406 and oscillator 501. An input of logic gate 416 is connected to the output of input stage 406.

The additional inputs of logic gate 416 are each connected to an input stage 401, 402, 403, 404 of input channels K1, K2, K3, or K4, respectively, directly or via additional means for pulse shaping. Logic gate 416 in the exemplary embodiment of FIG. 1 has a logical linkage of its input signals. The logical linkage is adjustable, advantageously deactivatable.

The selection of the logical linkage by logic gate 416 occurs here via a u-bit wide control line proceeding from a serial interface 600. For, for example, four logic states (2 bits), the u-bit wide control line advantageously has two control lines for the selection of the logical linkage and two additional control lines for the selection of the channel K1, K2, K3, or K4 to be linked. Logic gate 416 enables a logical linkage of an output signal of additional input stage 406 with at least one output signal of input stages 401, 402, 403, 404 of input channels K1, K2, K3, or K4, respectively.

Preferably, the output signal of the selected input stage 401, 402, 403, 404 of the corresponding input channel K1, K2, K3, or K4, respectively, or the output signals of a plurality of input stages 401, 402, 403, 404 controls a gating of the oscillation of oscillator 501. To this end, for example, the output signals of input stages 401, 402, 403, 404 are ORed among one another in logic gate 416. Beforehand, the output signals can be ANDed further with control signals. The ORed signal in this exemplary embodiment is inverted (NOR function). The inverted signal in this exemplary embodiment is in turn ANDed with the output signal of input stage 406. In this exemplary embodiment, a signal turns on oscillator 501 at the inputs ENO and NENO and turns off a simultaneous signal at one of the inputs E1 to E4 or NE1 to NE4. Alternatively, oscillator 501 can be turned off by the signal at the inputs ENO and NENO.

Alternatively or in addition to activation or gating of the signal of oscillator 501, preferably an oscillator frequency and/or a phase of the signal of oscillator 501 can be changed or adjusted by logic gate 416. For example, the oscillator frequency can be changed by switching between two register values or by changing a divider ratio of a frequency divider. Preferably, discrete values for the oscillator frequency and/or the amplitude and/or the phase can be selected by the input signals of logic gate 416.

Based on these dependent relationships, due to the possible connection of additional digital-to-analog converter 106 to output 124 of digital-to-analog converter 104 of master channel K4 and the different options for synchronization by means of logic gate 416, the surprising effect is achieved that the oscillation of the oscillator in regard to the oscillation periods and/or the amplitude and/or the phase depending on additional signals can be adjusted over a broad range and optimized for the particular type of laser and/or storage medium.

The mode of operation of the laser drive circuit for the case of reading of data from a data carrier (compact disc, DVD, Blue-ray) will be described hereinafter by way of example. For this purpose, a desired input reference current is applied at the input $I_R$ of the laser drive circuit and changed by scaling by current amplifier component 516 to current $I_{SR}$. The reference current $I_{SR}$ as input current $I_5$ reaches current input 115 of fifth digital-to-analog converter 105. By means of a p-bit wide parallel digital data line, the analog current amplification of fifth digital-to-analog converter 105 is set by means of a corresponding digital input value. For example, the p-bit wide data line has a few address bits for addressing fifth digital-to-analog converter 105. Preferably, the p-bit wide data line, however, has a bit width that corresponds to the sum of all databits for all digital-to-analog converters 101 to 105.

For example, the amplification is set to the value 1.2, so that input current $I_5$ is amplified by the factor 1.2 at current input 115 of fifth digital-to-analog converter 105 and flows as output current $I_{k5}$ from current output 125 of fifth digital-to-analog converter 105 into current input 205 of switching amplifier device 200. Said current $I_{k5}$ is switched in switching amplifier device 200 depending on the digital switching signal at input 215 of switching amplifier device 200 and is output as current amplified as a switched current, for example, at output 231 to laser diode 310.

The switching signal at switch input 215 reaches the laser drive circuit via input NE5 of fifth channel K5, whereby input NE5 is connected to switch input 215 of switching amplifier device 200 via an input stage 405. In addition to the current switched via switch input 215, the current switched by the clock of oscillator 501 at switch input 216 can be summed in switching amplifier device 200 and output amplified at output 231 for laser diode 310. The various laser diodes 310, 320, 330 in this case, depending on their construction, are connected either to ground GND or to a positive supply voltage.

The mode of operation of the laser drive circuit for the case of writing of data on a storage carrier (compact disc, DVD, Blue-ray) will be described hereinafter. For the write mode, the reference current $I_{SW}$, which flows via switch SW4 into current input 114 of fourth digital-to-analog converter 104, is generated by means of the input reference current $I_W$. Fourth digital-to-analog converter 104 in the exemplary embodiment of FIG. 1 is assigned to master channel K4. Channels K1, K2, and K3 can be operated optionally relative to the digital input channel signals at their inputs E1, NE1, E2, NE2, E3, NE3 and/or relative to the output current $I_{k1}$, $I_{k2}$, and $I_{k3}$ of the assigned digital-to-analog converter 101, 102, 103 independently or as a so-called slave channel dependent on master channel K4.

If, for example, the output current of first digital-to-analog converter 101 and second digital-to-analog converter 102 are operated depending on output current $I_{k4}$ of master digital-to-analog converter 104 of master channel K4, the current switches SW1 and SW2 are brought into such a position that current input 111 of first digital-to-analog converter 101 and current input 112 of second digital-to-analog converter 102 are connected to current output 142 of fourth digital-to-analog converter 104 of master channel K4.

Third digital-to-analog converter 103 can remain unused, for example, or current input 113 of third digital-to-analog converter 103 of third channel K3 is supplied by means of current switch SW3 with reference current $I_{SW}$ or reference current $I_{SR}$. Output current $I_{k1}$ of first digital-to-analog converter 101, connected as a slave, reaches current input 201 of switching amplifier device 200. Output current $I_{k2}$ of second digital-to-analog converter 102, connected as slave, reaches current input 202 of the switching amplifier device.

Output current $I_{k3}$ of digital-to-analog converter 103, switched in an independent mode, reaches current input 203 of switching amplifier device 200. Output current $I_{k4}$ of digital-to-analog converter 104, switched as master, reaches current input 204 of switching amplifier device 200 and in addition current inputs 111 and 112 of first digital-to-analog converter 101 and second digital-to-analog converter 102.

Switching amplifier device 200 in so doing switches these individual partial currents $I_{k1}$ to $I_{k4}$ depending on the switching signals at switch inputs 211, 212, 213, and 214 of input channels K1, K2, K3, and K4, respectively. Moreover, the currents are summed and amplified in switching amplifier device 200. The switching signal at switch input 214 of fourth input channel K4, used as the master channel, reaches from an input stage 404 directly to switching amplifier device 200. Input stages 401, 402, 403, and 404 of input channels K1, K2, K3, and K4 in this regard are formed as differential digital input stages, whereby each input stage is connected to a positive input E1, E2, E3, E4, EN0 and to a negative input NE1, NE2, NE3, NE4, and NEN0, respectively. Alternatively to the shown digital differential input stages 401, 402, 403, 404, and 406, single-pole input stages (not shown) can also be used exclusively for CMOS signals.

Variable logic gates 411, 412, and 413 are inserted between input stages 401, 402, and 403 of first input channel K1, of second input channel K2, and of third input channel K3 and the corresponding switch inputs 211, 212, and 213 of switching amplifier device 200. In each case, an input of logic gates 411, 412, 413 is connected to the output of input stage 404 of master channel K4.

The additional input of the respective logic gate 411, 412, and 413 is each connected to an input stage 401, 402, 403 of input channels K1, K2, or K3, respectively. Each logic gate in the exemplary embodiment of FIG. 1 is switchable between an AND operation, an OR operation, and deactivation of the operation. The switching in this regard occurs via an m-bit wide control line proceeding from a serial interface 600. For, for example, four logic states (2 bits), the m-bit wide control line therefore has a six-bit-wide (3×2) control line. Alternatively, in this case addressing could also be provided. The logic gates 411, 412, 413 enable linking of their two input signals, whereby the signal of master channel K4 is an input value of each linkage of logic gates 411, 412, 413.

For example, to form a special pulse shape for a laser diode, logic gate 411 is deactivated. In contrast, logic gates 412 and 413 are set to perform an AND operation, so that, for example, a high signal is put through at switch inputs 212 and 213 in switching amplifier device 200 only when both the digital input channel signal of master channel K4 and the digital input channel signal of channels K2 and K3 simultaneously have a high signal.

Because of these dependent relationships, via the digital-to-analog converters 101, 102, 103, and 104, which are connectable to one another, and the different options of synchronization by means of logic gates 411, 412, and 413, the surprising effect is achieved that virtually any setting of the shape of the laser current pulse is possible. In this regard, the especially great flexibility of setting of the shape of this laser current pulse is a surprising effect, which is achieved from the connection of digital-to-analog converters 101, 102, 103, and 104 optionally also in combination to current switches SW1, SW2, SW3 and the various synchronization modes by logic gates 411, 412 and 413.

To set the logical operations and/or amplifications, serial interface 600 is provided, which is connected to the three inputs SENB, SDATA, and SCLK of the laser drive circuit. Serial interface 600 is connected via various digital lines with a bit width of m, n, p, q, r, s, t, u, and v to the controlling or measuring functional units (101 to 106, 200, 411 to 413, 416, 501, 502, 515, 516, 601) of the laser drive circuit. A temperature sensor 601 can be integrated, for example, in addition. The system of the drive can provide a control loop to control the laser output. To this end, a photodiode is connected to a measuring circuit, which is set via the serial interface 600 of at least one of the digital-to-analog converters 101, 102, 103, 104, 105 and 106 and/or the current IW and/or the current IR particularly during the controlling.

Figure 2A:
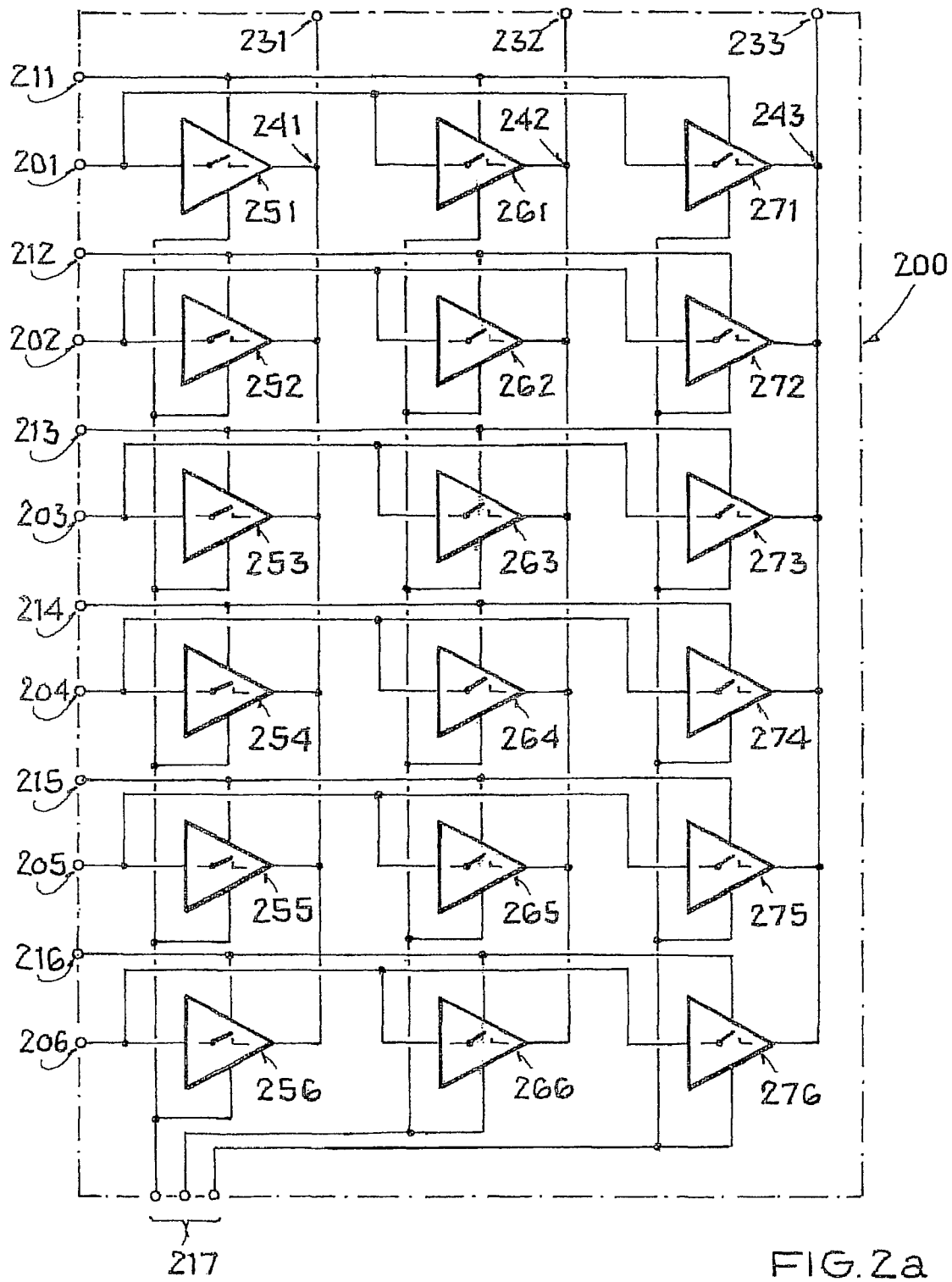
FIG. 2A shows a schematic block diagram of a switching amplifier device of the laser drive circuit.

A first exemplary embodiment of a switching amplifier device 200 is shown schematically in FIG. 2A. Switching amplifier device 200 has 18 switchable amplifier units 251 to 256, 261 to 266, and 271 to 276. The outputs of amplifier units 251 to 256 are connected to a current summation node 241. Furthermore, said current summation node 241 is connected to output 231 of switching amplifier device 200. The outputs of switchable amplifier units 261 to 266 are connected to current summation node 242. Current summation node 242 is connected in turn to output 232 of switching amplifier device 200. The switching outputs of switchable amplifier units 271 to 276 are connected to current summation node 243. Current summation node 243 is connected to output 233.

According to FIG. 1, a laser diode 310, 320, 330 can be connected at each output 231, 232, or 233, respectively. To select the respective output, switchable amplifier units 251 to 276 are connected to digital selection input 217. Amplifier units 251 to 276, associated with the respective output 231, 232, and 233, can be turned on and off by means of a digital control signal at selection input 217. Furthermore, switchable amplifier units 251 to 276 are switched by switching signals at switch inputs 211, 212, 213, 214, 215, and 216. The inputs of switchable amplifier units 251 to 276 are connected to current inputs 201, 202, 203, 204, 205, and 206.

If, for example, an input current at current input 201 is output amplified at output 233, switchable amplifier unit 271 is switched on by means of a switching signal at switch input 211 and a corresponding selection signal at selection input 217. In addition, additional currents can be switched and amplified by switchable amplifier units 272, 273, 274, and 275 or 276, whereby the output currents of switchable amplifier units 271 to 276 are summed in current summation node 243.

Alternatively to the exemplary embodiment of FIG. 1, the scaling function can be realized by current amplifiers 515 and 516 also within switching amplifier device 200. To this end, switching amplifier device 200 of FIG. 2A has, for example, per switchable amplifier unit, four parallel amplifier units (not shown), which, for example, each contribute a portion of a fourth for amplification. The individual parallel amplifier units in this regard form a means for setting the amplification of switching amplifier device 200. To set the scaling, the individual parallel amplifier units can be turned on or off by an r-bit wide data line (not shown).

Figure 2B:
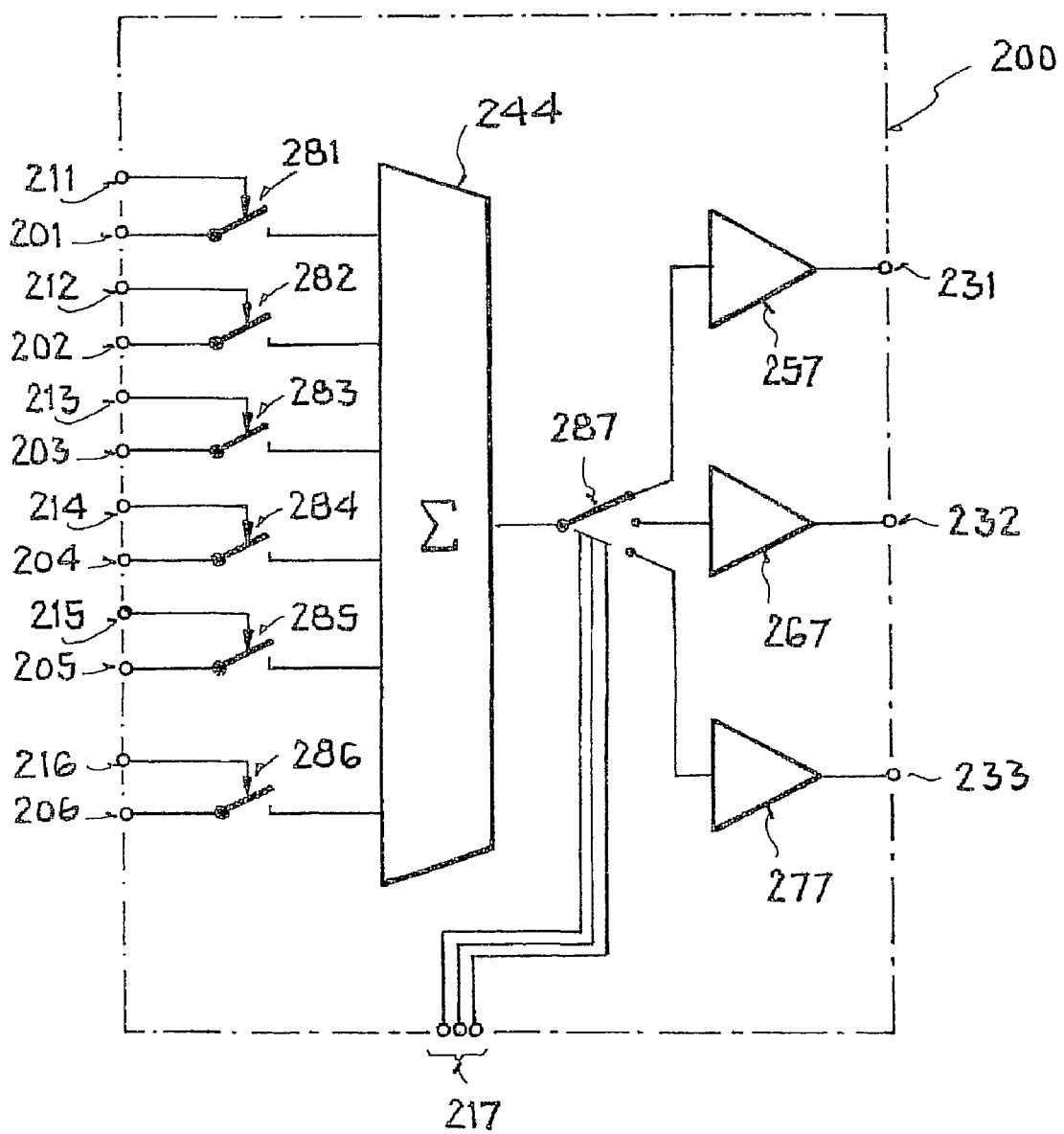
FIG. 2B shows a schematic drawing of an alternative exemplary embodiment of a switching amplifier device of the laser drive circuit.

An alternative embodiment of switching amplifier device 200 is shown as a schematic block diagram in FIG. 2B. In this exemplary embodiment, the switching amplifier device has current switches 281, 282, 283, 284, 285, and 286, which are connected directly to one of the current inputs 201, 202, 203, 204, 205, and 206, respectively, of switching amplifier device 200. The current inputs of current switches 281, 282, 283, 284, 285, and 286 are connected to switch inputs 211, 212, 213, 214, 215, and 216.

All switched input currents are summed in summation device 244 and by means of selection switch 287 switched to one of the output amplifiers 257, 267, or 277 depending on the switching signal at switch input 217. The outputs of output amplifiers 257, 267, and 277 are connected to outputs 231, 232, or 233, respectively, of the switching amplifier device.

The invention is not limited to the shown embodiment variants in FIGS. 1 through 2B. For example, it is possible to provide a different structure for switching amplifier device 200. Likewise, the connection of digital-to-analog converters 101 to 105 to one another can be changed, whereby repeated series connection of three or more digital-to-analog converters is also possible.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A laser drive circuit comprising:
a plurality of input channels configured to receive digital input channel signals;
at least one digital-to-analog converter, each input channel being assigned to at least one digital-to-analog converter, each digital-to-analog converter having a current input, a current output, and a digital data input, the digital-to-analog converter being configured to output an output current at the current output to amplify an input current at the current input by a current amplification as analog amplification, the digital-to-analog converter configured to convert a digital input value at the digital data input in the current amplification; and
a switching amplifier device, each input channel being connected to a switch input of the switching amplifier device,
at least one analog switch, wherein a current input of the at least one digital-to-analog converter is connected to the at least one analog switch
wherein the current output of each digital-to-analog converter is connected to a current input of the switching amplifier device, and
wherein the switching amplifier device is configured to switch each output current of each digital-to-analog converter according to the input channel signal of the associated input channel, to sum it, and to output it amplified to at least one output of the switching amplifier device.

2. The laser drive circuit according to claim 1, wherein a current output of at least one digital-to-analog converter is connectable to a current input of at least one additional digital-to-analog converter via the analog switch.

3. The laser drive circuit according to claim 1, wherein the current output of the at least one digital-to-analog converter is connectable to the current input of the additional digital-to-analog converter by the analog switch.

4. The laser drive circuit according to claim 1, wherein the at least one analog switch is connected to a first reference source to provide a first reference current and/or to a second reference source to provide a second reference current, so that the first reference current or the second reference current is switchable to the analog input of the digital-to-analog converter by the analog switch.

5. The laser drive circuit according to claim 1, further comprising a master channel and a number of slave channels, in which one of the digital-to-analog converters is assigned to the master channel, wherein the current output of the digital-to-analog converter assigned to the master channel is connectable to the current inputs of the digital-to-analog converters assigned to the slave channels via the analog switch.

6. The laser drive circuit according to claim 1, further comprising a master channel and a number of slave channels, wherein each slave channel has a configurable logic, wherein the input channel signals of the slave channels are logically linkable by the configurable logic by an AND or OR or EXCLUSIVE operation, to the input signal of the master channel for switching by the switching amplifier device.

7. The laser drive circuit according to claim 1, wherein the switching amplifier device has a component for setting the amplification of the switching amplifier device, the component including switchable amplifier units connected parallel to one another.

8. The laser drive circuit according to claim 1, further comprising:
an oscillator whose output is connected to a switch input of the switching amplifier device to output a digital oscillator signal; and
an additional digital-to-analog converter, whose current output to output an additional output current is connected to a current input of the switching amplifier device,
wherein the switching amplifier device is formed to switch the additional output current in the oscillator signal clock, and also to sum it and to output it amplified at the at least one output.

9. The laser drive circuit according to claim 8, further comprising:
an additional analog switch, which is connected to an additional current input of the additional digital-to-analog converter and to the first reference source and/or to the second reference source and/or to one or more of the current outputs of the digital-to-analog converter.

10. The laser drive circuit according to claim 8, further comprising:
an additional configurable logic, whose output is connected to an input of the oscillator and/or to the additional digital-to-analog converter,
wherein the additional configurable logic and/or the oscillator is configured to change a gating of the oscillation of the oscillator and/or an oscillator frequency of the oscillator and/or an amplitude of the oscillator signal and/or a phase of the oscillator signal by a logical linking of one or more input channel signals of the channels and/or by control signals.

11. A laser drive circuit comprising digital-to-analog converters, each having a current input and a current output to set current values of partial currents that are switchable by digital channel signals, to provide a laser current pulse at least on the basis of a sum of the partial currents, wherein at least one current output of one of the digital-to-analog converters is connected to at least one current input of an additional digital-to-analog converter via an analog switch.

12. The laser drive circuit of claim 11, wherein the analog switch has a plurality of current inputs, said output of one of the digital-to-analog converters being connected to one of said current inputs, and a given reference current being connected to another of said current inputs, wherein said laser drive circuit further comprises a control logic for controlling said analog switch to connect one said output of one of the digital-to-analog converters and said given reference current to said at least one current input of said additional digital-to-analog converter, wherein said additional digital-to-analog converter generates an additional partial current.

13. The laser drive circuit of claim 11, further comprising a switching amplifier device having current inputs for receiving said partial currents and having switch control inputs for receiving said digital channel signals, wherein said switching amplifier device sums said partial currents based, at least in part, on said digital channel signals received by said switch control inputs.

14. The laser drive circuit of claim 12, further comprising a switching amplifier device having current inputs for receiving said partial currents and having switch control inputs for receiving said digital channel signals, wherein said switching amplifier device sums said partial currents based, at least in part, on said digital channel signals received by said switch control inputs.

* * * * *